(12) United States Patent
Rinehart et al.

(10) Patent No.: US 8,089,150 B2
(45) Date of Patent: Jan. 3, 2012

(54) STRUCTURALLY ROBUST POWER SWITCHING ASSEMBLY

(76) Inventors: Lawrence E. Rinehart, West Linn, OR (US); Guillermo L. Romero, Phoenix, AZ (US)

(*) Notice: Subject to any disclaimer, the term of this patent is extended or adjusted under 35 U.S.C. 154(b) by 697 days.

(21) Appl. No.: 11/985,344

(22) Filed: Nov. 14, 2007

(65) Prior Publication Data
US 2008/0158924 A1    Jul. 3, 2008

Related U.S. Application Data

(60) Provisional application No. 60/858,801, filed on Nov. 14, 2006.

(51) Int. Cl.
*H01L 23/488* (2006.01)
*H01L 23/528* (2006.01)

(52) U.S. Cl. ............. 257/737; 257/747; 257/780

(58) Field of Classification Search ............. 257/669, 257/674, 692, 735, 737, 738, 747, 691, 780; 361/704, 712, 723, 743, 772, 813, 820; 363/144, 363/147; 174/535, 536, 558
See application file for complete search history.

(56) References Cited

U.S. PATENT DOCUMENTS

| | | | | |
|---|---|---|---|---|
| 5,438,166 A | * | 8/1995 | Carey et al. | 174/261 |
| 6,738,258 B2 | * | 5/2004 | Bijlenga et al. | 361/704 |
| 7,679,197 B2 | * | 3/2010 | Otremba | 257/777 |

FOREIGN PATENT DOCUMENTS

DE    102006008632 A1 *  8/2007

* cited by examiner

*Primary Examiner* — Gary L Laxton
(74) *Attorney, Agent, or Firm* — Timothy E. Siegel Patent Law, PLLC; Timothy E. Siegel

(57) ABSTRACT

A structurally robust power switching assembly, comprising a first rigid structural unit that defines a first unit major surface that is patterned to define a plurality of mutually electrically isolated, electrically conductive paths. Also, a similar, second rigid structural unit is spaced apart from the first unit major surface. Finally, a transistor is interposed between and electrically connected to the first unit major surface and the second unit major surface.

10 Claims, 6 Drawing Sheets

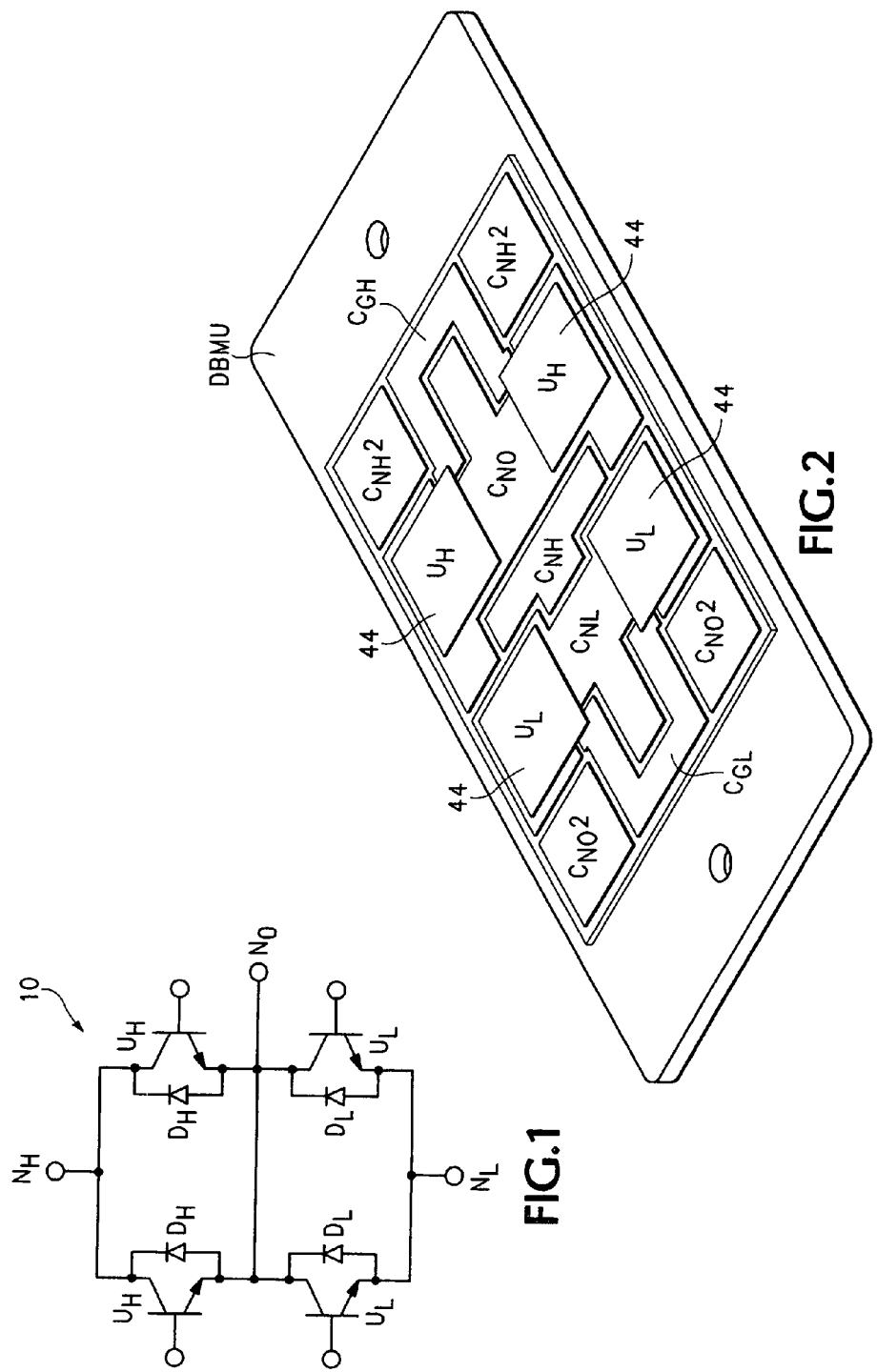

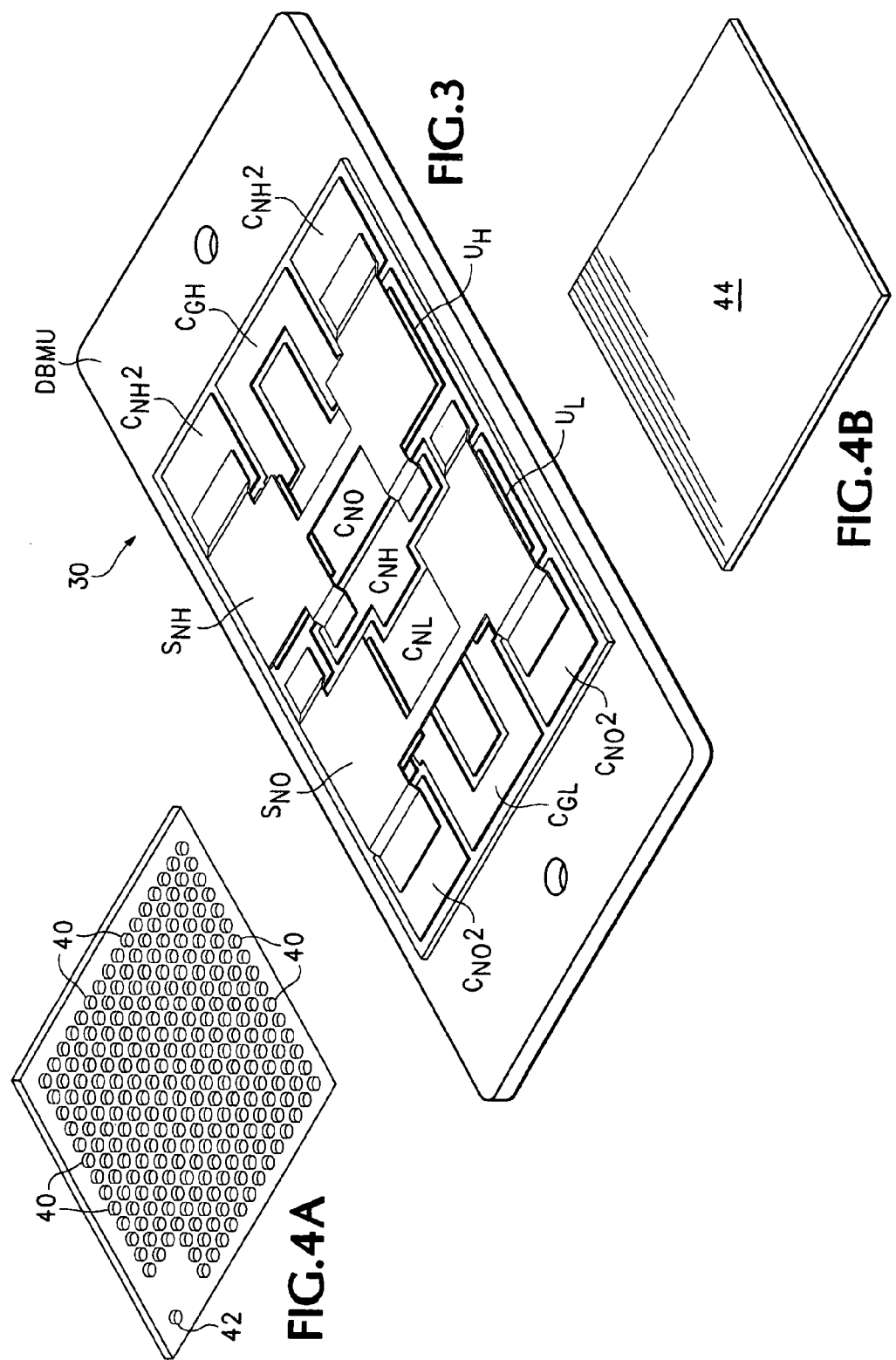

STRUCTURALLY ROBUST POWER SWITCHING ASSEMBLY

CROSS REFERENCE TO RELATED APPLICATION

This application claims the benefit of U.S. Provisional Application No. 60/858,801, filed Nov. 14, 2006.

BACKGROUND OF THE INVENTION

Power switching assemblies have many uses, including converting AC current to DC current and converting DC current to AC current. DC current may be converted to AC current for the purpose of driving an AC motor or as part of a process for converting DC current at a first frequency and/or voltage to DC current at a second frequency and/or voltage. These conversions and mechanisms for accomplishing these conversions are frequently necessary in the electrical engineering world. As fossil fuels become rarer, it is likely that the need to perform these conversions will become even more common, as electrical energy is gleaned from nature-dictated, rarely tapped sources, such as sun, wind and ocean movement, and processed into forms that electrical appliances have been built to accept.

A few fundamental problems face designers of power switching assemblies. Whereas the transistors, typically metal oxide semiconductor field effect transistors (MOSFETS) or insulated gate bipolar transistors (IGBTS) are made largely of silicon oxide crystal, which has a coefficient of thermal expansion (COTE) of about 2.3. Although it is advantageous to use a high thermal conductivity material to draw the heat out of the transistors, only diamond has both high thermal conductivity and a low COTE. Accordingly, most high thermal conductivity materials used create a COTE mismatch at some point in the system.

In addition, both MOSFETs and IGBTs have a very thin (@100 nm), very delicate layer of metal oxide on a major surface of the silicon oxide substrate. Great care must be taken in electrically connecting this layer, to avoid a connection that would physically damage the metal oxide layer during manufacturing or thermal cycling.

In a separate development, due to an ability to withstand higher temperatures than other popular semiconductors used for power switches, silicon carbide metal semiconductor field effect transistors (MESFETS) are gaining popularity in the power semiconductor field.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

In a first separate aspect, the present invention may take the form of a structurally robust power switching assembly, comprising a first rigid structural unit that defines a first unit major surface that is patterned to define a plurality of mutually electrically isolated, electrically conductive paths. Also, a similar, second rigid structural unit is spaced apart from the first unit major surface. Finally, a transistor is interposed between and electrically connected to the first unit major surface and the second unit major surface.

In a second separate aspect, the present invention may take the form of a structurally robust power switching assembly, comprises a power transistor that includes a thin and delicate layer of metal oxide. A major surface of the layer of metal oxide is substantially coincident with a major surface of the power transistor. Also, the major surface of the power transistor defines an emitter. In addition, a set of highly conductive pillars constructed out of a relatively soft material, supported by the emitter. A rigid structure is thermally mismatched to the major surface of the transistor and defines an electrically conductive pathway that is rigidly and electrically connected to the set of pillars. Finally, the highly conductive pillars are adapted to mitigate stress on the layer of metal oxide due to the thermal expansion mismatch between the rigid structure and the major surface of the transistor.

In a third separate aspect, the present invention may take the form of a structurally robust power switching assembly that includes a power transistor, comprising a thin and delicate layer of metal oxide, and a major surface of the layer of metal oxide being substantially coincident with a major surface of the power transistor, the major surface of the power transistor defining both an emitter and a gate. Dielectric material is placed over a portion of the emitter, and abutting the gate and a highly conductive pillar constructed out of a relatively soft material is supported by the gate and the dielectric material, so that it has a larger area than would be possible if it was supported only by the gate.

In addition to the exemplary aspects and embodiments described above, further aspects and embodiments will become apparent by reference to the drawings and by study of the following detailed descriptions.

BRIEF DESCRIPTION OF THE DRAWINGS

Exemplary embodiments are illustrated in referenced figures of the drawings. It is intended that the embodiments and figures disclosed herein are to be considered illustrative rather than restrictive.

FIG. 1 is a circuit diagram, showing the circuit physically implemented in FIGS. 3, 10 and 11.

FIG. 2 is a top-perspective view of a work piece that represents a stage in the manufacturing of an electrical switching assembly.

FIG. 3 is a top-perspective view of the work piece of FIG. 1 at a later stage in the manufacturing process.

FIG. 4A is a perspective view of the gate and emitter side of an IGBT having copper pillars to ease the manufacturing process and conduct heat.

FIG. 4B is a perspective view of the collector side of the IGBT of FIG. 3.

DETAILED DESCRIPTION OF THE PREFERRED EMBODIMENT(S)

Figure 5:
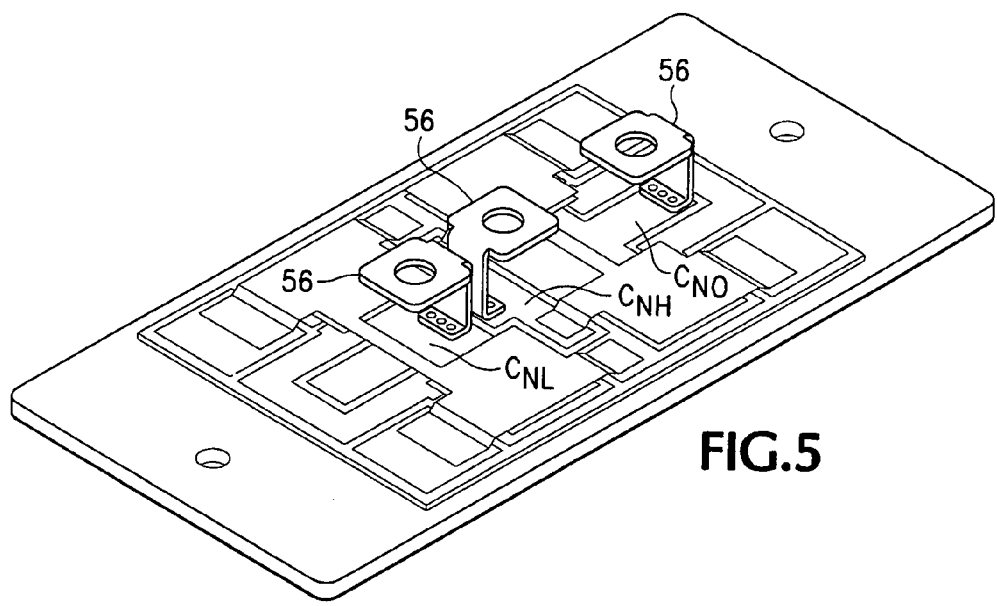
FIG. 5 is a top perspective view of the work piece of FIG. 3, showing electrical connectors that have been attached.

In a first preferred embodiment the present invention takes the form of a switching assembly 10 according to the schematic diagram of FIG. 1. A first pair insulated gate bipolar transistor (IGBTS) $U_H$, placed in parallel, each include an emitter that is tied to a high voltage node $N_H$, for example 48 VDC. The collector of the first IGBT pair $U_H$ is the output node $N_O$, on which a square wave voltage typically would be produced by circuit 10, in operation. A second IGBT pair $U_L$, each has a collector that is connected to the output node $N_O$ and an emitter that is connected to a low voltage (e.g. −48 VDC) or ground node $N_L$. In operation, the gates of IGBTs $U_H$ and $U_L$ are toggled on and off, to alternately permit current to flow from the high voltage node $N_H$ to the output node $N_O$ and from output node $N_O$ to the low voltage node $N_L$.

As both IGBT pairs $U_H$ and $U_L$ cannot be on simultaneously there is typically a brief moment during switching when both IGBT pairs are off. Because the current through output node $N_O$ cannot change instantaneously, a pair of diodes $D_H$ bleed the current flowing from $N_O$ up to the high voltage node $N_H$, immediately after IGBTS $U_L$ have turned off and from low voltage node $N_L$ to output node $N_O$ immediately after IGBTS $U_H$ have turned off.

Two challenges that designers face when developing a physical implementation of this circuit are minimizing losses due to circuit inductance and accommodating thermal mismatch between the semiconductor material of IGBT pairs $U_H$ and $U_L$ and the thermally conductive material, such as copper, used to sink heat away from IGBT pairs $U_H$ and $U_L$, to prevent them from overheating. Moreover, the IGBTs $U_H$ and $U_L$ are planar and have a delicate layer of metal oxide on a major surface, which defines the emitter and the gate.

Referring to FIG. 2-4, the switching circuit 10 may take physical form in an assembly 30. In order to accommodate the thermal mismatch and to reduce the risk of damaging the metal oxide layer during manufacturing, a set of copper pillars 40 and 42 (FIG. 4A) are grown on the emitter and gate, respectively, of IGBTs $U_H$ and $U_L$. The pillars 40 on the emitters of IGBTs $U_H$ are electrically and physically connected, typically by flow soldering, to an output node electrically conductive pathway $C_{NO}$ defined on the surface of a direct bond metal (DBM) substrate DBMU. The single pillar 42 on the gate is electrically and physically connected to a high-transistor gate electrically-conductive pathway $C_{GH}$ on the same DBM substrate DBMU. As is well known in the art, the collector surface of an IGBT is far more resilient then the emitter and gate surface. Accordingly the collector of $U_H$ is electrically and physically attached to a high node metal (typically copper) strap $S_{NH}$, which is attached to a high-node electrically conductive pathway $C_{NH}$ on DBM unit DBMU. The connection of strap $S_{NH}$ may be accomplished also with flow soldering, but with a solder having a lower melting point and at a lower temperature than that previously used for the DBM connections, to avoid disturbing the DBM connections.

Figure 6:
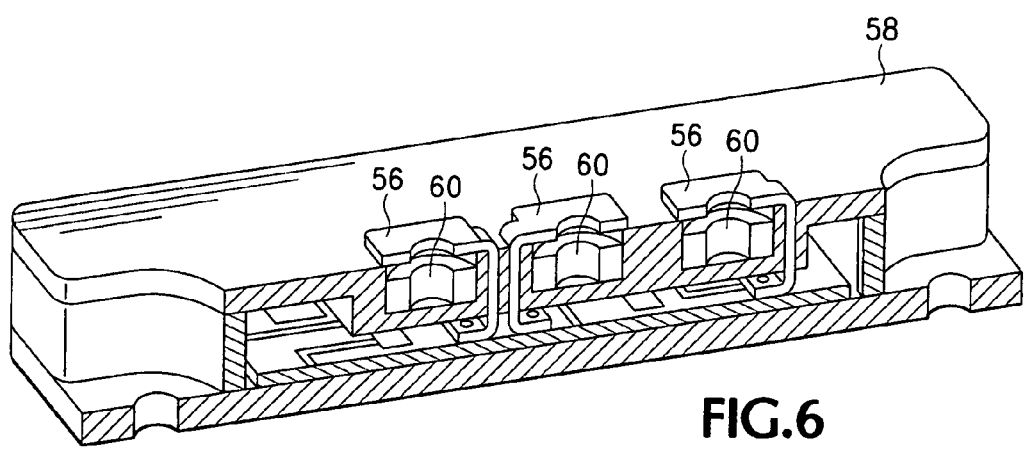
FIG. 6 shows the work piece of FIG. 5, further having a housing.

As indicated in FIG. 1, the collector of each low node IGBT $U_L$ is connected to the emitter of the corresponding high node IGBT $U_L$. Physically, this is accomplished by an additional copper strap $S_{NO}$ (FIG. 3) that is connected to the collector of IGBT $U_L$ and to the output-node pathway $C_{NO}$. Much in the same manner as the emitter of IGBTs $U_H$ (and contemporaneously) the emitter of IGBT $U_L$ is flow soldered to a low-node conductive pathway $C_{NL}$. Referring to FIG. 5, conductive pathways $C_{NH}$, $C_{NO}$ and $C_{NL}$ form robust platforms for power connectors 56 which are flow soldered on. Returning to FIG. 3, Copper straps $S_{NH}$ and $S_{NO}$ each terminate in a copper pathway $C_{NH}2$ and $C_{NO}2$, respectively, which have no electrical function but help to draw heat away from the IGBTs $U_H$ and $U_L$. Finally, a housing 58 (FIG. 6) is introduced containing captured nuts 60, to facilitate connection to a set of busses. Housing 58 can also serve as a coolant conduit.

Figure 7:
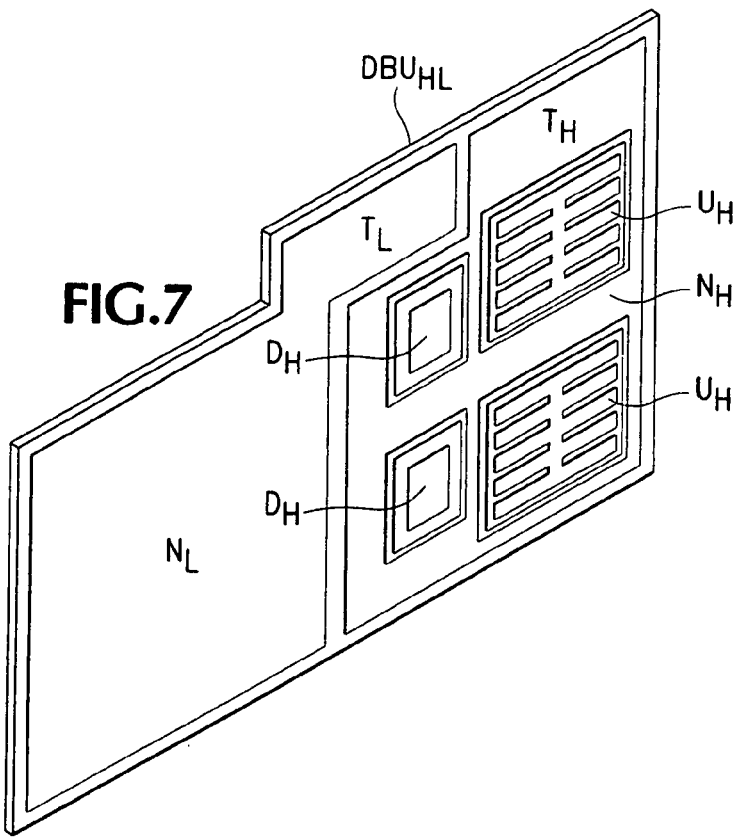
FIG. 7 is a work piece used in the construction of an alternative embodiment of a switching circuit.
Figure 9A:
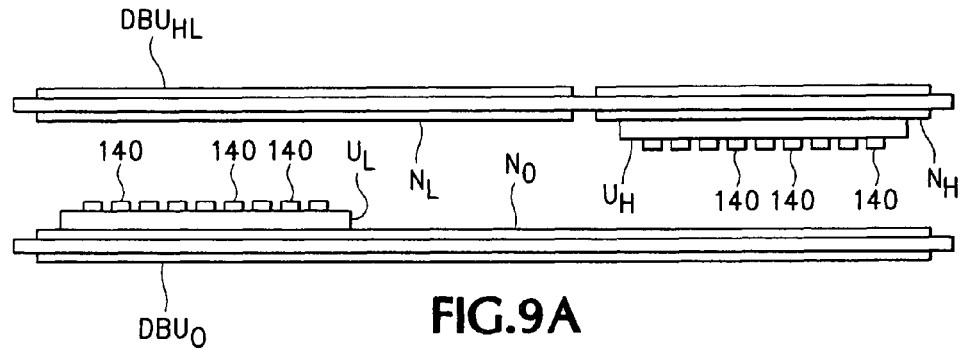
FIG. 9A shows a further step in the production of the alternative embodiment.
Figure 9B:
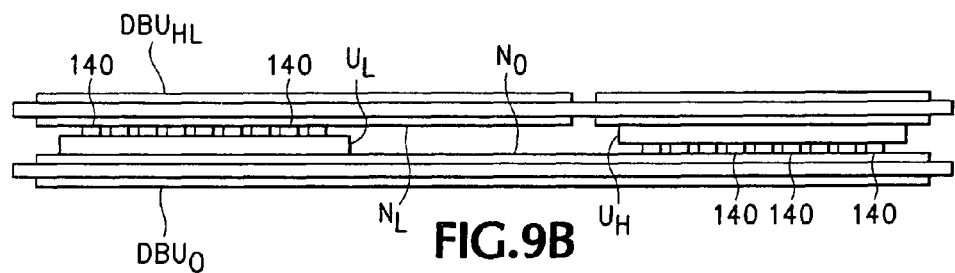
FIG. 9B shows a step that immediately follows the step of FIG. 9A in the construction of the alternative embodiment.
Figure 10:
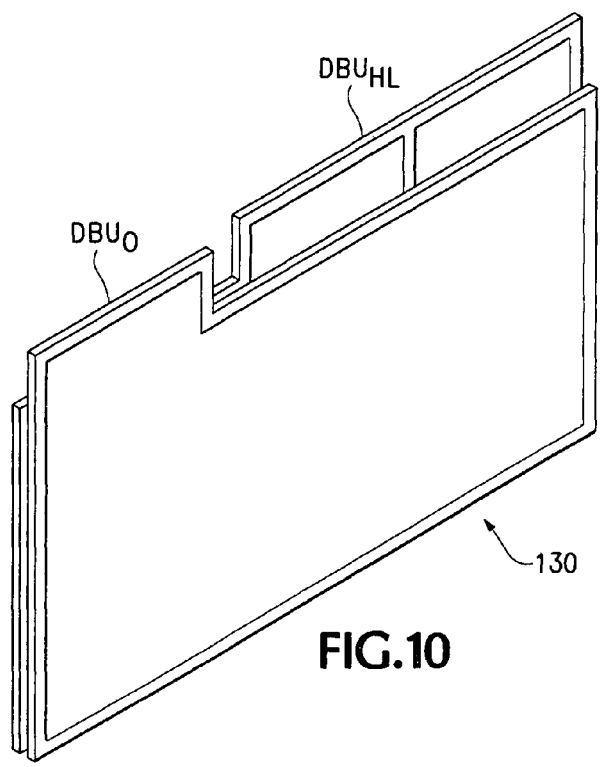
FIG. 10 shows a completed switching assembly.
Figure 11:
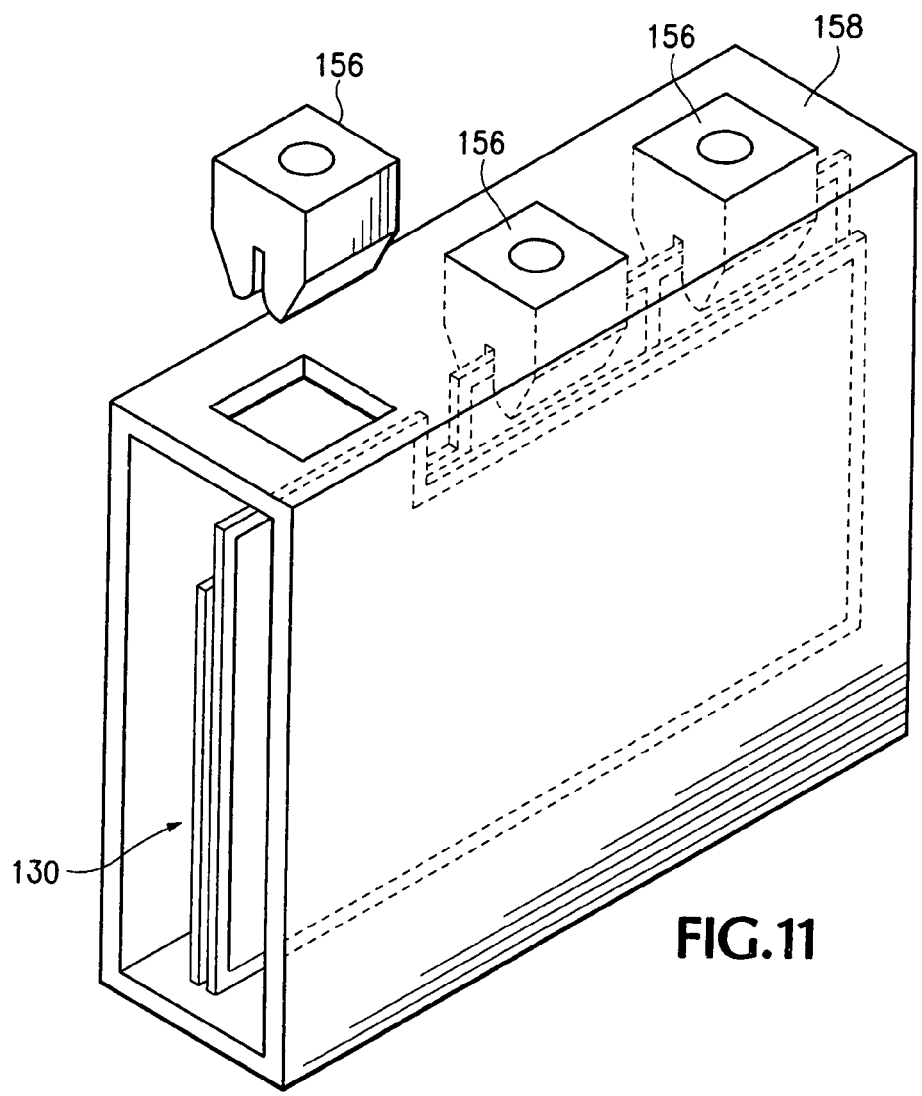
FIG. 11 shows the switching assembly of FIG. 10, in a housing and with electrical connectors.

FIGS. 7-11 show a method of constructing an alternative preferred embodiment 130 (FIGS. 10 and 11). Referring to FIG. 7, a first DBM unit $DBU_{HL}$, which includes both high voltage node $N_H$ and low voltage node $N_L$, in the form of two metalized regions, separated by a break in the metal (typically copper) and each having a tab $T_H$ and $T_L$, respectively, for connection to high and low voltage busses, respectively.

Each of two high-node IGBTS $U_H$ is soldered to node $N_H$ by way of its collector, which is quite hardy. The exposed, active surfaces of IGBTS $U_H$ define a gate and emitter, both of which are covered with copper pillars 140 (FIGS. 9A and 9B). The two diodes $D_H$ are also soldered to the same node and perform the same function as in the above described embodiment.

Figure 8:
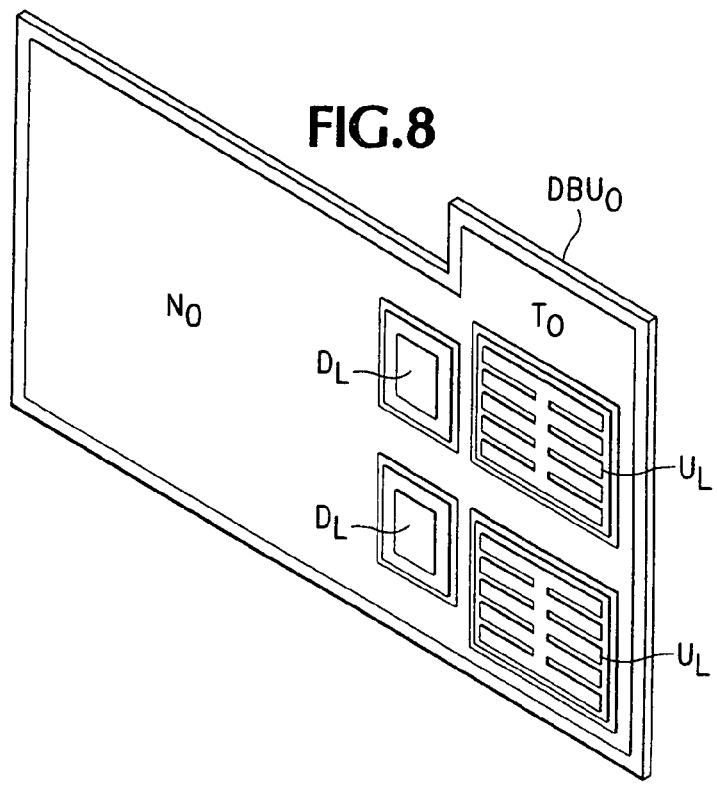
FIG. 8 is an additional work piece used in the construction of the same alternative embodiment.

Referring to FIG. 8, a second DBM unit $DBU_O$ has a parallel construction to $DBU_{HL}$, except for that it has just a single node $N_O$ and a single tab $T_O$, for connection to an output buss. A pair of IGBTs $U_L$ is soldered to node $N_O$ by way of the IGBT collectors, as are diodes $D_L$. Similar to IGBTs $U_H$ the gate and emitter of $U_{HL}$ are covered with copper pillars.

Referring to FIGS. 9A and 9B, in the manufacturing process, unit $DBU_{HL}$ and $DBU_O$ are faced toward each other so that the bump covered 140 emitters of IGBTs $U_H$ both face node $N_O$ and the similarly covered emitters of IGBTS $U_L$ each face node $N_L$. Then units $DBU_{HL}$ and $DBU_O$ are flow soldered together, forming a circuit 10 (FIG. 1), in a finished physical switching assembly 130 (FIG. 10). Skilled persons will recognize that the gates of IGBTS $U_H$ and $U_L$ may be connected by a copper wire, previously attached. Referring to FIG. 11 buss terminals 156 and a fluid-containing housing 158 complete the assembly 130.

Skilled persons will readily appreciate that assembly 130 offers many advantages over prior art switching systems. The copper node regions $N_H$, $N_L$ and $N_O$ have a large surface area and volume, providing a robust path for current flow. Moreover, the emitters of IGBTs $U_N$ are brought about as close as physically possible to the collectors of IGBTs $U_L$, minimizing the current flow distance. Further, heat is free to exit IGBTs $U_H$ and $U_L$ through both $DBU_{HL}$ and $DBU_O$.

In another advantage, the exterior of the finished assembly 130 is electrically passive. Accordingly if the inside is sealed against fluid flow by introducing a sealing agent around the margins of assembly 130, it may be cooled with a conductive fluid such as water, or a water base solution. In addition, thermally conductive protrusions may be added to the exterior sides of assembly 116 aiding the exhausting of heat.

One design tool which may be used in the construction of either assembly 30 or assembly 130 addresses the problem of the small area presented by the gate of an IGBT. If a copper strap is to be joined to a copper pillar 42 on the IGBT gate, it may prove quite difficult to align it with a pillar the size of an IGBT gate, prior to soldering. Accordingly, an insulating sheet material may be deposited onto a portion of the IGBT emitter immediately adjacent to the gate, and the copper pillar for the gate may be grown, in part, on this insulating sheet so that it can have a larger surface area than would be otherwise possible. This facilitates the alignment operation in attaching the gate to a copper strap. For the case in which the gate is to be attached to a DBC unit, the larger surface area of the copper pillar facilitates a robust attachment.

While a number of exemplary aspects and embodiments have been discussed above, those of skill in the art will recognize certain modifications, permutations, additions and sub-combinations thereof. For example, although power transistors $U_H$ and $U_L$ are IGBTs in the above described embodiment, in an additional embodiment they are silicon carbide MESFETs and $D_H$ and $D_L$ are silicon carbide Schottky diodes. It is therefore intended that the following appended claims and claims hereafter introduced are interpreted to include all such modifications, permutations, additions and sub-combinations as are within their true spirit and scope.

The invention claimed is:

1. A structurally robust power switching assembly, comprising:
    (a) a first power transistor and a second power transistor, both comprising a thin and delicate layer of metal oxide, and, for both, a major surface of said layer of metal oxide being substantially coincident with a major surface of said power transistor, said major surface of said first power transistor defining a first emitter, and said major surface of said second power transmitter defining a second emitter;
    (b) a set of more than 50 highly conductive first pillars constructed out of a relatively soft material, supported by said first emitter and a set of more than 50 highly conductive second pillars constructed out of a relatively soft material, supported by said second emitter; and
    (c) a rigid structure being thermally mismatched to both said major surface of said first power transistor and said major surface of said second power transistor, and defining a first electrically conductive pathway that is rigidly and electrically connected to said set of first pillars and a second electrically conductive pathway that is rigidly and electrically connected to said set of second pillars; and
    (d) wherein said highly conductive pillars are adapted to mitigate stress on each said layer of metal oxide due to said thermal expansion mismatch between said rigid structure and said major surface of both said first power transistor and said second power transistor.

2. The assembly of claim 1 wherein said major surface of said first power transistor also defines a gate and wherein said gate bears at least one pillar of highly electrically conductive, relatively soft material, which is in turn physically and electrically connected to an electrical pathway of said first rigid structure.

3. The assembly of claim 1 wherein said rigid structure is a patterned direct bond metal unit.

4. The assembly of claim 1 wherein said rigid structure includes a pair of metal straps.

5. The assembly of claim 4 wherein said pair metal straps is a pair copper straps.

6. The power switching assembly of claim 1 wherein said transistors are isolated gate bipolar transistors (IGBTs).

7. The power switching assembly of claim 1 wherein said transistors are metal oxide semiconductor field effect transistors (MOSFETS).

8. The power switching assembly of claim 7 wherein both transistors include an emitter, a gate and a collector and wherein said first transistor emitter is electrically connected to said second transistor collector.

9. The assembly of claim 1, wherein said columns have been grown on said layer of metal oxide semiconductor.

10. The assembly of claim 1, wherein said columns are formed from a single material.

* * * * *